(12) United States Patent
Chu et al.

(10) Patent No.: US 8,445,888 B1
(45) Date of Patent: May 21, 2013

(54) RESISTIVE RANDOM ACCESS MEMORY USING RARE EARTH SCANDATE THIN FILM AS STORAGE MEDIUM

(75) Inventors: Jinn Chu, Taipei (TW); Wen-Zhi Chang, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 0 days.

(21) Appl. No.: 13/404,192

(22) Filed: Feb. 24, 2012

(51) Int. Cl.
*H01L 45/00* (2006.01)

(52) U.S. Cl.
USPC .................. 257/4; 257/512; 257/E21.001

(58) Field of Classification Search
USPC .............. 257/2, 4, 512, E21.001, E21.006, 257/E45.003
See application file for complete search history.

(56) References Cited

U.S. PATENT DOCUMENTS

2009/0272961 A1* 11/2009 Miller et al. .................. 257/4

* cited by examiner

*Primary Examiner* — Roy Potter (57) ABSTRACT

The present invention relates to a resistive random access memory using the rare earth scandate thin film as the storage medium, comprising a substrate, an insulation layer, a first electrode layer, a resistive memory layer, and a second electrode layer. In the present invention, it uses an amorphous rare earth scandate layer as the resistive memory layer of the resistive random access memory. Therefore, the resistive random access memory using the rare earth scandate thin film as the storage medium having advantages of low operation voltage and low power consumption can easily be manufactured without using any forming process or thermal annealing process. Moreover, through the characteristics of unipolar resistance switching behavior revealed by the amorphous rare earth scandate layer, the resistive random access memory using rare earth scandate thin film as the storage medium is able to perform a high resistance state and a low resistance state.

7 Claims, 7 Drawing Sheets

RESISTIVE RANDOM ACCESS MEMORY USING RARE EARTH SCANDATE THIN FILM AS STORAGE MEDIUM

BACKGROUND OF THE INVENTION

1. Technical Field

The present invention relates to a resistive random access memory, and more particularly, to a resistive random access memory using the rare earth scandate thin film as the storage medium.

2. Description of Related Art

With the evolution of the times, the development of technologies has a great progress. In particular, the digital electronic products are invented and widely used in human life. When using the electronic products, the electronic documents and digital data processed by the electronic products need to be stored in memories for caching or accessing. Generally, memories are divided into volatile memories and non-volatile memories, in which the new-generation non-volatile memories consist of ferroelectric random access memory (FeRAM), magnetoresistive random access memory (MRAM), phase-change random access memory (PRAM), and resistive random access memory (RRAM).

Figure 1:
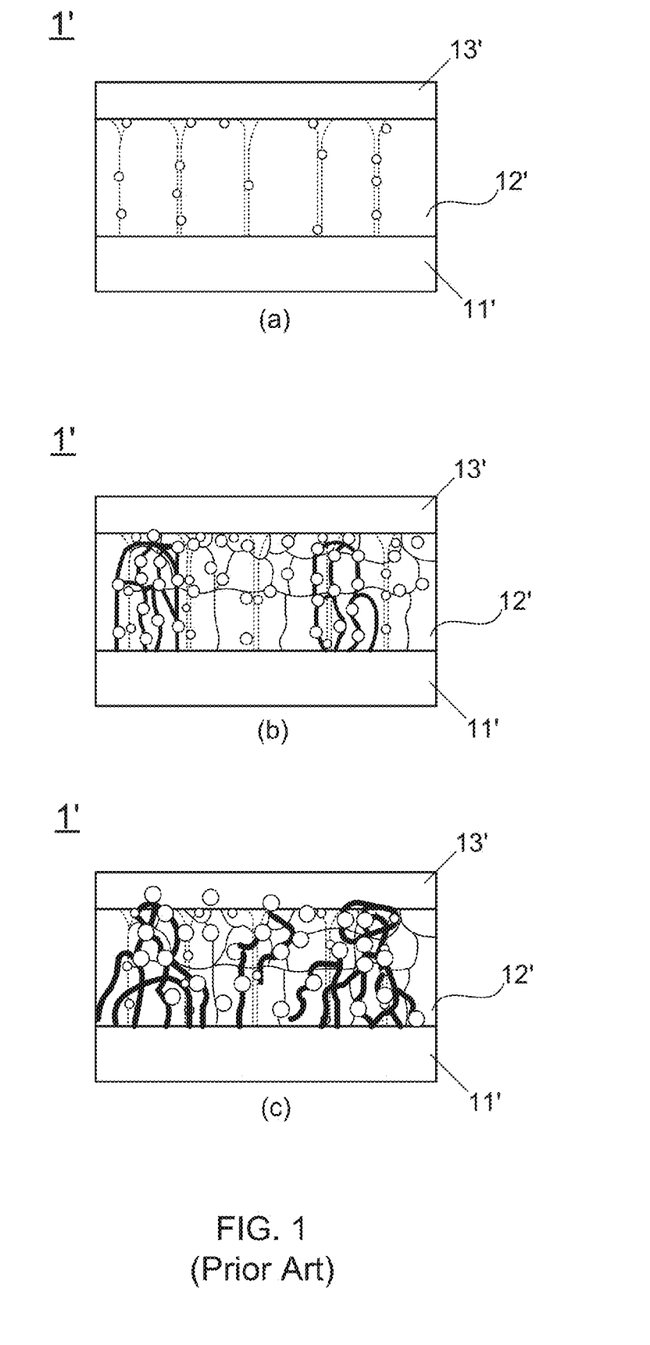
FIG. 1 is a cross-sectional view of a conventional resistive random access memory.

In application, the resistive random access memory (RRAM) includes advantages of low operation voltage, low power consumption, fast read speed, and simple structure, so that, the resistive random access memory is widely studied and evaluated. Please refer to FIG. 1, which illustrates a cross-sectional view of a conventional resistive random access memory. As shown in FIG. 1, the conventional resistive random access memory 1' includes: a bottom electrode 11', a resistive memory layer 12' and a top electrode 13', wherein the manufacturing material of the bottom electrode 11' and the top electrode 13' are platinum (Pt), and manufacturing material of the resistive memory layer 12' is $NiO_x$.

Figure 2:
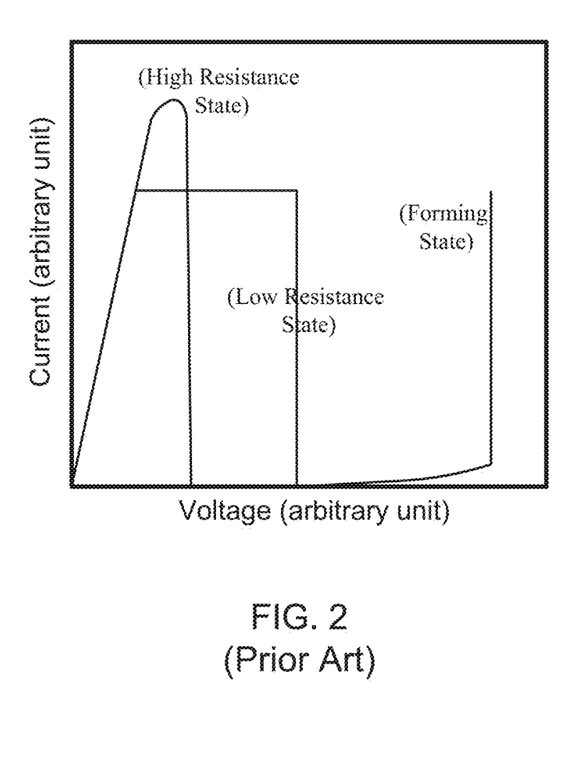
FIG. 2 is a current-voltage curve plot of the conventional resistive random access memory.

Continuously referring to FIG. 1, and please simultaneously refer to FIG. 2, there is shown a current-voltage curve plot of the conventional resistive random access memory. As shown in FIG. 1(*a*), initially, there is no any voltage applied to the bottom electrode 11' and the top electrode 13' of the resistive random access memory 1', and the resistive random access memory 1' shows a high resistance state. When applying a voltage to the bottom electrode 11' and the top electrode 13, as shown in FIG. 1(*b*), the applied voltage drives Ni atoms of the NiO move toward the defects in the $NiO_x$, and then the moving Ni atoms may gradually gather and form a plurality of metal filaments. Therefore, as shown in FIG. 2, the current-voltage characteristic of the resistive random access memory 1' converts to a forming state from the high resistance state. Finally, as shown in FIG. 1(*c*), the metal filaments formed by the gather of the Ni atoms would connects the bottom electrode 11' with the top electrode 13', meanwhile, as shown in FIG. 2, the current-voltage characteristics of the resistive random access memory 1' converts to a low resistance state from the forming state.

According to prior research literatures and records, the manufacturing material of the top electrode 13' can also be titanium (Ti) or copper (Cu), and the manufacturing material of the resistive memory layer 12' can also be $ZrO_2$ or $SiO_2$. However, regardless of the manufacturing material of the resistive memory layer 12' is the $ZrO_2$ or the $SiO_2$, the metal filaments forming procedure must be executed in the conventional resistive random access memory 1' for making the resistive random access memory 1' include the resistance conversion characteristic. Thus, based on the above descriptions, the person skilled in the RRAM technology is able to know that the conventional resistive random access memory 1' has the drawbacks and the shortcomings as follows:

1. For making the aforesaid resistive random access memory 1' include the resistance conversion characteristic, it must complete the metal filaments forming procedure of the resistive random access memory 1' in advance; however, the breakdown of the resistive memory layer 12' may occur in the resistive random access memory 1' when high voltage is applied to the resistive random access memory 1'.
2. Inheriting to above point 1, it would yield high power consumption when the high voltage is applied to the resistive random access memory 1' for executing the metal filaments forming procedure. The high voltages applied may also result in the breakdown (failure) device.
3. Generally, the resistive random access memory 1' needs to be executed a thermal annealing process after the resistive random access memory 1' is fabricated; For this reason, the thermal budget of the resistive random access memory 1' is very high. Such thermal annealing is one of possible causes that could lead to the device failure.

Accordingly, in view of the conventional resistive random access memory still having shortcomings and drawbacks, the inventor of the present application has made great efforts to make inventive research thereon and eventually provided a resistive random access memory using the rare earth scandate thin film as the storage medium.

BRIEF SUMMARY OF THE INVENTION

The primary objective of the present invention is to provide a resistive random access memory using rare earth scandate thin film as the storage medium, in which it uses an amorphous rare earth scandate layer as the resistive memory layer of the resistive random access memory. So that, the resistive random access memory with storage medium of rare earth scandate thin film with advantages of low operation voltage and low power consumption can easily be manufactured without using any thermal annealing or forming process.

The another objective of the present invention is to provide a resistive random access memory using the rare earth scandate thin film as the storage medium, in which it uses an amorphous rare earth scandate layer as the resistive memory layer of the resistive random access memory. Therefore, through the characteristics of unipolar resistance switching behavior revealed by the amorphous rare earth scandate layer, the resistive random access memory with the storage medium of rare earth scandate thin film is able to perform a high resistance state and a low resistance state.

Accordingly, to achieve the above objectives of the present invention, the inventor proposes a resistive random access memory using rare earth scandate thin film as the storage medium, comprising:

a substrate;

an insulation layer, being formed on the substrate;

a first electrode layer, being stably formed on the insulation layer through an adhesion-enhancing layer;

a resistive memory layer, being formed on the first electrode layer, wherein the resistive memory layer is an amorphous rare earth scandate layer formed by way of chemical combination of a single rare-earth atom and a plurality of oxygen atoms, and the amorphous rare earth scandate layer having the oxygen atoms of atom percent; and a second electrode layer, being formed on the resistive memory layer;

wherein the amorphous rare earth scandate layer shows the characteristics of unipolar resistance switching behavior when an external voltage is applied to the first electrode layer and the second electrode layer.

BRIEF DESCRIPTION OF THE SEVERAL VIEWS OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE INVENTION

To more clearly describe a resistive random access memory using the rare earth scandate thin film as the storage medium according to the present invention, embodiments of the present invention will be described in detail with reference to the attached drawings hereinafter.

Figure 3:
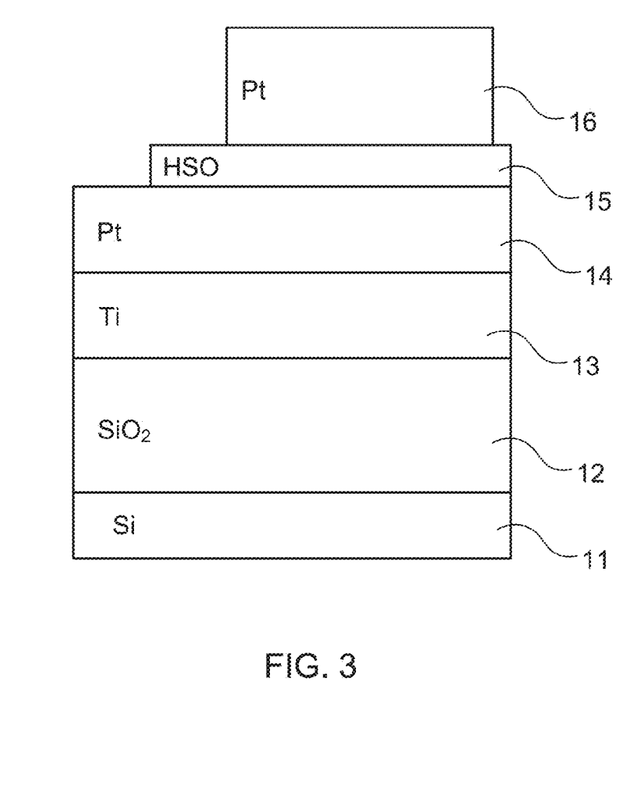
FIG. 3 is a schematic framework diagram of a resistive random access memory using rare earth scandate thin film as the storage medium according to the present invention.

Please refer to FIG. 3, which illustrates a schematic framework diagram of a resistive random access memory using the rare earth scandate thin film as the storage medium according to the present invention. As shown in FIG. 3, the resistive random access memory 1 using rare earth scandate thin film as the storage medium includes: a substrate 11, an insulation layer 12, a first electrode layer 14, a resistive memory layer 15, and a second electrode layer 16. In the present invention, it uses a silicon-on-insulator (SOI) substrate for replacing the substrate 11 and the insulation layer 12, and the first electrode layer 14, the resistive memory layer 15 and the second electrode layer 16 are sequentially formed on the insulation layer 12 of the SOI substrate.

Continuously referring to FIG. 3, the first electrode layer 14 and the second electrode layer 16 are the bottom electrode and the top electrode of the resistive random access memory 1, respectively, in which the manufacturing material of the first electrode layer 14 and the second electrode layer 16 can be platinum (Pt), gold (Au), ruthenium (Ru), palladium (Pd). Preferably, in the present invention, the manufacturing material of the first electrode layer 14 and the second electrode layer 16 is Pt. Particularly, in the present invention, an adhesion-enhancing layer 13 is formed between the first electrode layer 14 and the insulation layer 12, so as to make the first electrode layer 14 be stably formed on the insulation layer 12. The adhesion-enhancing layer 13 is titanium (Ti) layer.

Figure 4:
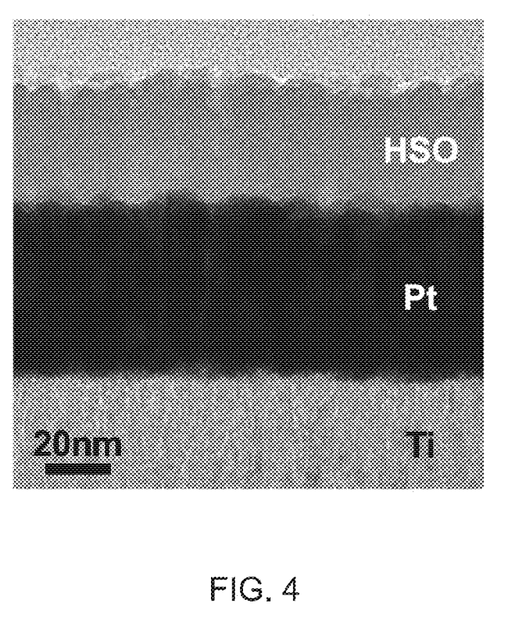
FIG. 4 is a transmission electron microscope (TEM) image of the resistive random access memory with the storage medium of rare earth scandate thin film.

In the resistive random access memory 1 using rare earth scandate thin film as the storage medium, the thickness of the resistive memory layer is ranged from 50 nm to 120 nm, and the resistive memory layer 15 is an amorphous rare earth scandate layer formed by way of chemical combination of a single rare-earth atom and a plurality of oxygen atoms, wherein the amorphous rare earth scandate layer having the oxygen atoms of 51 atom percent. Therefore, through the characteristics of unipolar resistance switching behavior revealed by the amorphous rare earth scandate layer, resistive random access memory 1 using rare earth scandate thin film as the storage medium introduced in the present invention is able to perform a high resistance state and a low resistance state when an external voltage is applied to the first electrode layer 14 and the second electrode layer 16. Because natural rare-earth elements consist of Holmium (Ho), lanthanum (La), cerium (Ce), praseodymium (Pr), neodymium (Nd), promethium (Pm), samarium (Sm), europium (Eu), gadolinium (Gd), terbium (Tb), dysprosium (Dy), erbium (Er), thulium (Tm), ytterbium (Yb), lutetium (Lu), and yttrium (Y), the amorphous rare earth scandate layer can be $LaScO_3$, $CeScO_3$, $PrScO_3$, $NdScO_3$, $PmScO_3$, $SmScO_3$, $EuScO_3$, $GdScO_3$, $TbScO_3$, $DyScO_3$, $HoScO_3$ (HSO), $ErScO_3$, $TmScO_3$, $YbScO_3$, and $YScO_3$. In the present invention, it uses $HoScO_3$ (HSO) as a sputtering target for manufacturing the amorphous rare earth scandate layer. For manufacturing the amorphous rare earth scandate layer, the sputtering target of $HoScO_3$ (HSO) is disposed into the chamber of an RF magnetron sputtering equipment filled with Argon (Ar) gas, and then the amorphous HSO film of 36 nm can be fabricated by way of RF magnetron sputtering process. Thus, please refer to FIG. 4, there is shown a transmission electron microscope (TEM) image of the resistive random access memory 1 using rare earth scandate thin film as the storage medium manufacturing by using the RF magnetron sputtering process. Moreover, as shown in FIG. 4, Pt layer/Ti layer/$SiO_2$ layer/Si layer has excellent adhesion.

Figure 5:
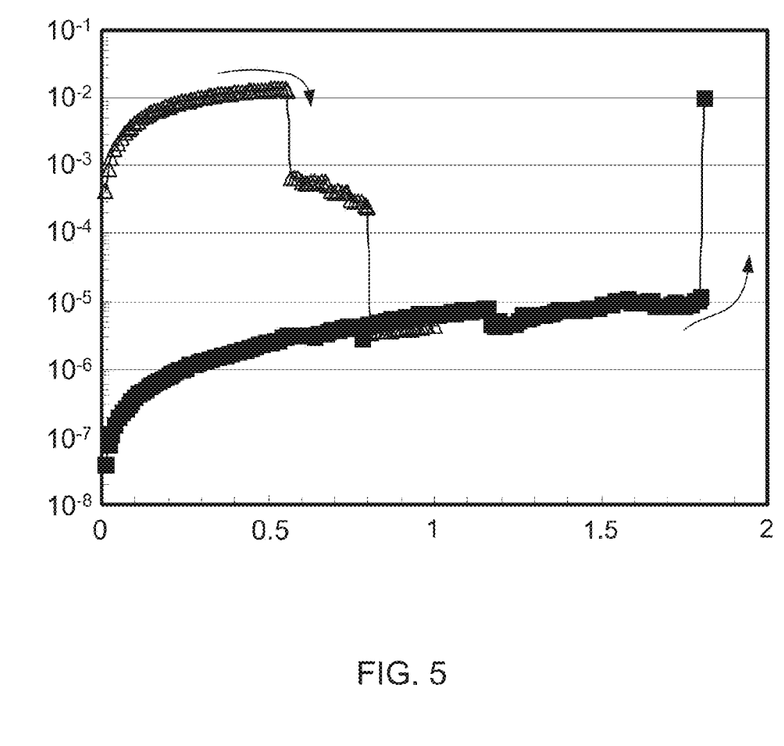
FIG. 5 is a current-voltage curve plot of the resistive random access memory using rare earth scandate thin film as the storage medium.

In addition, for proving resistive random access memory 1 using rare earth scandate thin film as the storage medium is an excellent resistive random access memory (RRAM), the current-voltage characteristics and the resistance conversion characteristics of the resistive random access memory 1 using rare earth scandate thin film as storage medium have been measured. Please refer to FIG. 5 and FIG. 6, there are shown a current-voltage curve plot and a cyclic resistance conversion plot of the resistive random access memory using rare earth scandate thin film as storage medium. The current-voltage curve plot of FIG. 5 is obtained by electrically measuring the resistive random access memory 1 using rare earth scandate thin film as the storage medium, and the resistive random access memory 1 is fabricated by the RF magnetron sputtering process without using any thermal annealing process. Clearly, in the current-voltage curve plot, the measured current of the resistive random access memory 1 increases from a low current level to a high current level when the voltage applied to the first electrode 14 and the second electrode 16 is gradually increased from 0V to 1.8V. It means that the resistive random access memory 1 is converted from a high resistance state to a low resistance state.

Figure 6:
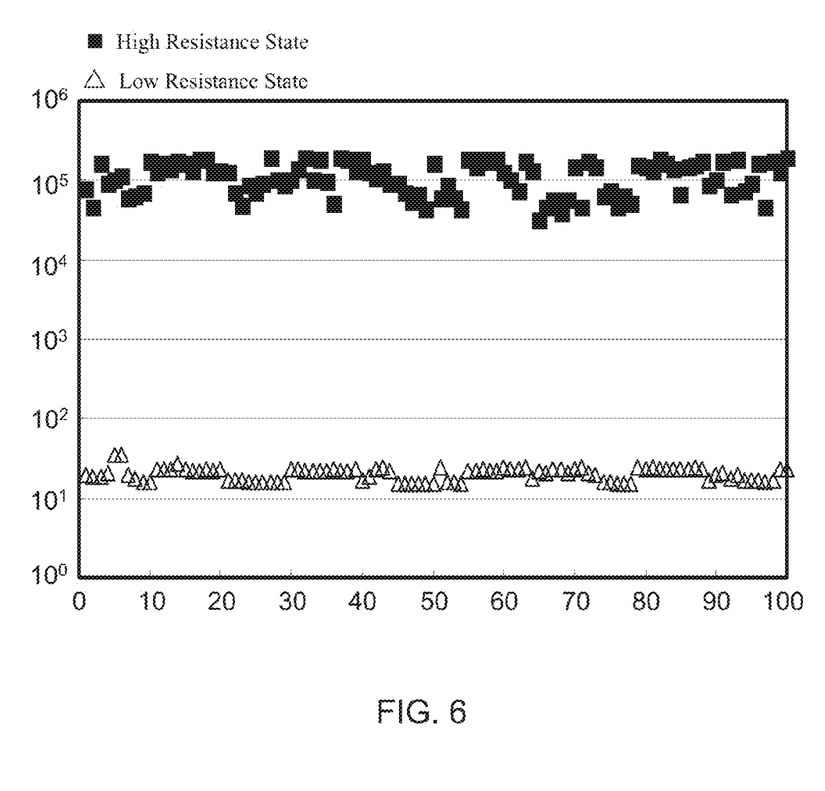
FIG. 6 is a cyclic resistance conversion plot of the resistive random access memory using rare earth scandate thin film as the storage medium.

Continuously referring to FIG. 5, when the voltage is applied to the first electrode 14 and the second electrode 16 once again and increased from 0V to 0.8V, the measured current of the resistive random access memory 1 decreases from the low current level to the high current level. It means that the resistive random access memory 1 is converted from the low resistance state to the high resistance state. So that, the current-voltage curve plot of FIG. 5 proves that the resistive random access memory 1 using rare earth scandate thin film as storage medium of the present invention includes high resistance and low resistance characteristics. Moreover, as shown in FIG. 6, the cyclic resistance conversion plot further shows that the resistive random access memory 1 using rare earth scandate thin film as the storage medium still performs a stably high resistance ratio after being repeatedly converted in a high resistance state and a low resistance state.

Figure 7:
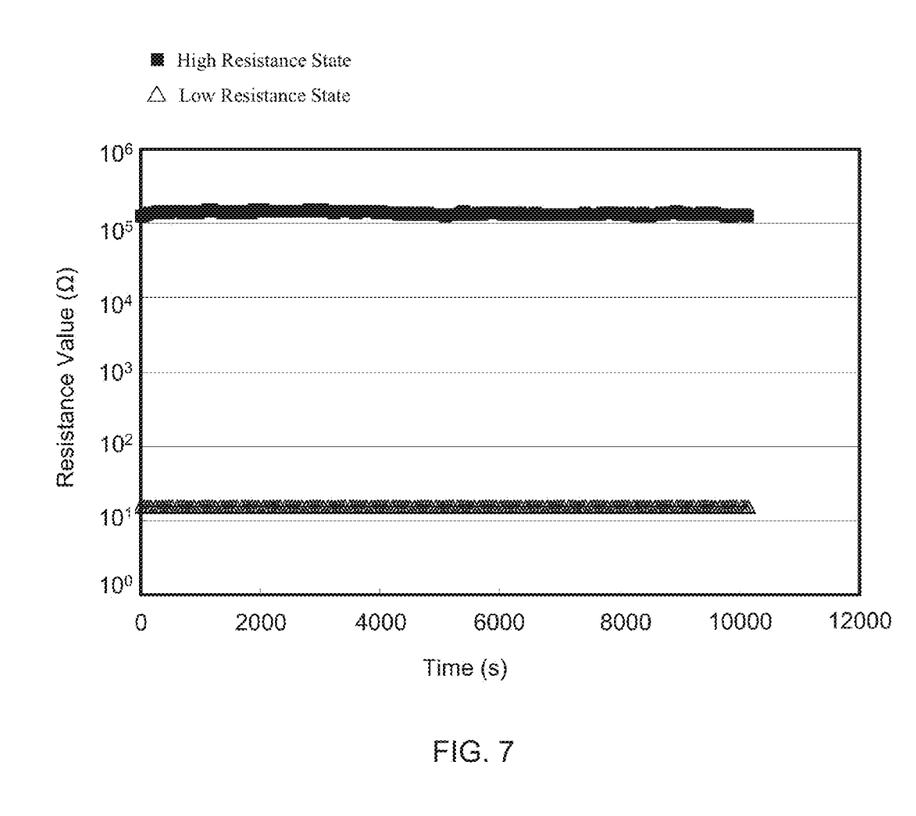
FIG. 7 is a time versus resistance value plot of the resistive random access memory using rare earth scandate thin film as the storage medium for up to $10^4$ seconds.

Furthermore, in order to prove the reliability of the resistive random access memory 1 using rare earth scandate thin film as the storage medium of the present invention, data retention experiments have been completed. Please refer to FIG. 7, there is shown a time v.s. resistance value plot of the resistive random access memory using rare earth scandate thin film as the storage medium. As shown in FIG. 7, after the resistive random access memory 1 is converted to the high resistance state, the resistive random access memory 1 retains its high-resistance value during the course of measurement up to $10^4$ seconds; similarly, during the same period of measurement, the resistive random access memory 1 retains its low-resistance value after it is converted to the low resistance state. Thus, the experiment result of data retention shown in FIG. 7 proves that the resistive random access memory 1 using rare earth scandate thin film as the storage medium of the present invention has excellent reliability.

Therefore, the above descriptions have been clearly and completely introduced the resistive random access memory 1 using rare earth scandate thin film as the storage medium of the present invention. In summary, the present invention has the following advantages:

1. The resistive random access memory 1 using rare earth scandate thin film as the storage medium provided in the present invention naturally includes the resistance conversion characteristics without being formed any metal filaments in the resistive memory layer beforehand.
2. Inheriting to above point 1, because the resistive random access memory 1 using rare earth scandate thin film as the storage medium naturally includes the resistance conversion characteristics, it includes the advantages of low operation voltage and low power consumption. Besides, the breakdown of the resistive memory layer would not likely occur in the resistive random access memory with the storage medium of rare earth scandate thin film.
3. Inheriting to above point 1, because the resistive random access memory with storage medium of rare earth scandate thin film is fabricated by the RF magnetron sputtering process without using any thermal annealing process, the thermal budget of the resistive random access memory with the storage medium of rare earth scandate thin film is much less than the thermal budget of the conventional resistive random access memory.
4. The resistive random access memory with the storage medium of rare earth scandate thin film can still perform a stably high resistance ratio after being repeatedly converted in a high resistance state and a low resistance state.

The above description is made on embodiments of the present invention. However, the embodiments are not intended to limit scope of the present invention, and all equivalent implementations or alterations within the spirit of the present invention still fall within the scope of the present invention.

We claim:

1. A resistive random access memory using rare earth scandate thin film as the storage medium, comprising:
   a substrate;
   an insulation layer, being formed on the substrate;
   a first electrode layer, being stably formed on the insulation layer through an adhesion-enhancing layer;
   a resistive memory layer, being formed on the first electrode layer, wherein the resistive memory layer is an amorphous rare earth scandate layer formed by way of chemical combination of a single rare-earth atom and a plurality of oxygen atoms, and the amorphous rare earth scandate layer having the oxygen atoms of 51 atom percent wherein the thickness of the resistive memory layer is ranged from 36 nm to 120 nm; and
   a second electrode layer, being formed on the resistive memory layer;
   wherein the amorphous rare earth scandate layer shows the characteristics of bipolar resistance switching behavior when an external voltage is applied to the first electrode layer.
2. The resistive random access memory using rare earth scandate thin film as storage medium of claim 1, wherein the manufacturing material of the first electrode layer is selected from the group consisting of platinum (Pt), gold (Au), ruthenium (Ru), palladium (Pd).
3. The resistive random access memory using rare earth scandate thin film as storage medium of claim 1, wherein the manufacturing material of the second electrode layer is selected from the group consisting of: platinum (Pt), gold (Au), ruthenium (Ru), palladium (Pd).
4. The resistive random access memory using rare earth scandate thin film as the storage medium of claim 1, wherein the manufacturing material of the amorphous rare earth scandate layer is selected from the group consisting of $LaScO_3$, $CeScO_3$, $PrScO_3$, $NdScO_3$, $PmScO_3$, $SmScO_3$, $EuScO_3$, $GdScO_3$, $TbScO_3$, $DyScO_3$, $HoScO_3$, $ErScO_3$, $TmScO_3$, $YbScO_3$, and $YScO_3$.
5. The resistive random access memory using rare earth scandate thin film as the storage medium of claim 1, wherein the manufacturing material of the adhesion-enhancing layer is titanium (Ti).
6. The resistive random access memory using rare earth scandate thin film as the storage medium of claim 1, wherein the manufacturing material of the substrate is silicon (Si).
7. The resistive random access memory using rare earth scandate thin film as the storage medium of claim 6, wherein a silicon-on-insulator (SOI) substrate can be used for replacing the substrate and the insulation layer.

\* \* \* \* \*